United States Patent
Zhao et al.

(10) Patent No.: US 9,985,644 B1
(45) Date of Patent: May 29, 2018

(54) DIGITAL TO-TIME CONVERTER AND METHOD THEROF

(71) Applicant: Realtek Semiconductor Corp., Hsinchu (TW)

(72) Inventors: Yu Zhao, San Jose, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days. days.

(21) Appl. No.: 15/872,017

(22) Filed: Jan. 16, 2018

(51) Int. Cl.
*H03M 1/66* (2006.01)
*H03M 1/82* (2006.01)

(52) U.S. Cl.
CPC ................. *H03M 1/82* (2013.01)

(58) Field of Classification Search
CPC .... H03M 1/82; H03M 1/0891; H03M 1/1974; H03M 1/0995
USPC .................................. 341/144–150
See application file for complete search history.

(56) References Cited

U.S. PATENT DOCUMENTS

| | | | |
|---|---|---|---|
| 9,705,512 B1 * | 7/2017 | Kuan | H03L 7/0891 |
| 9,819,356 B2 * | 11/2017 | Ponton | H03M 1/662 |
| 9,819,479 B2 * | 11/2017 | Degani | H04L 7/002 |
| 9,853,650 B1 * | 12/2017 | Kuan | H03L 7/087 |
| 2016/0149584 A1 * | 5/2016 | Tertinek | H03K 5/06 341/152 |
| 2016/0173119 A1 * | 6/2016 | Ponton | H03M 1/662 375/219 |
| 2017/0093556 A1 * | 3/2017 | Degani | H04L 7/002 |
| 2017/0194982 A1 * | 7/2017 | Gu | H03M 1/82 |

* cited by examiner

*Primary Examiner* — Lam T Mai
(74) *Attorney, Agent, or Firm* — McClure, Qualey & Rodack, LLP

(57) ABSTRACT

A DTC (digital-to-time converter) includes: an inverter configured to receive an input clock at an input node and output an output clock at an output node, and a variable source degeneration network controlled by a digital word, wherein the inverter includes a transistor with a gate terminal connected to the input node, a drain terminal coupled to the output node, and a source terminal connected to the variable source degeneration network, and the variable source degeneration network includes a parallel connection of a resistor and a digitally-controlled capacitor of a capacitance controlled by the digital word.

11 Claims, 5 Drawing Sheets

DIGITAL-TO-TIME CONVERTER AND METHOD THEROF

BACKGROUND OF THE DISCLOSURE

Field of the Disclosure

The present disclosure generally relates to digital-to-time converters and more particularly to digital-to-time converters capable of covering a wide timing range.

Description of Related Art

As is known, a conventional digital-to-time converter (DTC) outputs a clock signal of a timing controlled by a digital code. As depicted in FIG. 1, a prior art DTC 100 comprises: an inverter 110 configured to receive a first clock signal $V_1$ and output a second clock signal $V_2$ at an output node 101, and a digitally-controlled capacitor 120 configured to provide a capacitive load at the output node 101 with a shunt capacitance controlled by a digital code $D_C$. The inverter 110 comprises a PMOS (p-channel metal oxide semiconductor) transistor 111 and a NMOS (n-channel metal oxide semiconductor) transistor 112. Throughout this disclosure, $V_{DD}$ denotes a power supply node. A timing difference between the first clock signal $V_1$ and the second clock signal $V_2$ depends on the shunt capacitance provided by the digitally-controlled capacitor 120, and thus depends on the digital code $D_C$. More specifically, a larger shunt capacitance will lead to a larger delay and thus a later timing for the second clock signal $V_2$. Therefore, a timing of the second clock signal $V_2$ can be controlled by the digital code $D_C$.

A drawback of the prior art DTC 100 is: the digitally-controlled capacitor needs to have a wide tuning range to cover a wide timing range for the second clock signal $V_2$. Therefore, what is desired is DTC that can cover a wide timing range with a tunable capacitance of a narrow tuning range.

SUMMARY OF THE DISCLOSURE

In an embodiment, a DTC (digital-to-time converter) includes: an inverter configured to receive an input clock at an input node and output an output clock at an output node, and a variable source degeneration network controlled by a digital word, wherein the inverter includes a transistor with a gate terminal connected to the input node, a drain terminal coupled to the output node, and a source terminal connected to the variable source degeneration network, and the variable source degeneration network includes a parallel connection of a resistor and a digitally-controlled capacitor of a capacitance controlled by the digital word.

In an embodiment, a method includes the following steps: incorporating an inverter to receive an input clock at an input node and output an output clock at an output node, wherein the inverter includes a transistor of a first type with a gate terminal connected to the input node, a drain terminal coupled to the output node, and a source terminal connected to a source node; terminating the source node with a variable degeneration network including a parallel connection of a resistor and a variable capacitance controlled by a digital word; and controlling a timing of the output clock by setting a value of the digital word.

DETAILED DESCRIPTION OF THIS DISCLOSURE

The present disclosure is directed to digital-to-time converters. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "circuit node," "power node," "ground node," "inverter," "voltage," "current," "CMOS (complementary metal oxide semiconductor)," "PMOS (P-channel metal oxide semiconductor) transistor," "NMOS (N-channel metal oxide semiconductor) transistor," "resistor," "capacitor," "clock," "signal," "load," "cascode," and "source degeneration." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

This disclosure is presented in an engineering sense (i.e., from the perspective of a person having ordinary skill in the art), instead of a rigorous mathematical sense. For instance, "A is equal to B" means "a difference between A and B is smaller than an engineering/practical tolerance."

Throughout this disclosure, a ground node is used as a reference node of zero voltage (0V) electrical potential. A power supply node is denoted by "$V_{DD}$." A clock is a voltage signal that cyclically toggles back and forth between a low level (e.g. 0V) and a high level (e.g., the electrical potential at the power supply node "$V_{DD}$," or $V_{DD}$ for short).

Figure 2:
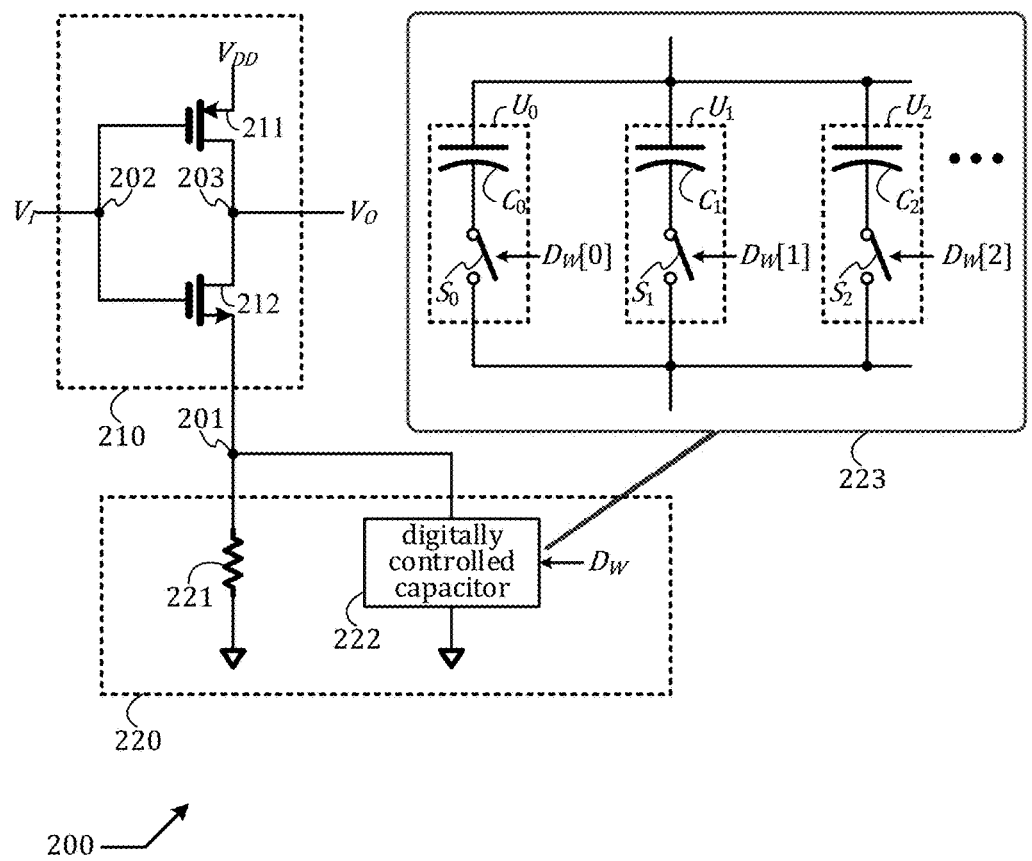
FIG. 2 shows a schematic diagram of a digital-to-time converter in accordance with an embodiment of the present disclosure

A digital-to-time converter (DTC) 200 in accordance with an embodiment of the present disclosure is shown in FIG. 2. DTC 200 comprises: an inverter 210 configured to receive an input clock $V_I$ at an input node 202 and output an output clock $V_O$ at an output node 203, and a variable source degeneration network 220 configured to provide a variable source degeneration to the inverter 210 at a source node 201, wherein the variable source degeneration network 220 comprises a parallel connection of a shunt resistor 221 and a digitally-controlled capacitor 222 controlled by a digital word $D_W$. The inverter 210 comprises a PMOS transistor 211 and a NMOS transistor 212. The source, gate, and drain terminals of the PMOS transistor 211 connect to the power supply node $V_{DD}$, the input node 202, and the output node 203, respectively. The source, gate, and drain terminals of the NMOS transistor 212 connect to the source node 201, the input node 202, and the output node 203, respectively. As shown in callout box 223, the digitally-controlled capacitor 222 is embodied by a switch capacitor array comprising a parallel connection of a plurality of switch capacitor units $U_0$, $U_1$, $U_2$, and so on, wherein each switch capacitor unit comprises a series connection of a capacitor and a switch controlled by a respective bit of the digital work $D_W$. For instance, $U_0$ ($U_1$, $U_2$) comprises a series connection of capacitor $C_0$ ($C_1$, $C_2$) and switch $S_0$ ($S_1$, $S_2$) controlled by $D_W[0]$ ($D_W[1]$, $D_W[2]$). As is known in the art, a switch capacitor array can be used to embody a digitally-controlled capacitor. Therefore, this aspect need not be described in detail herein.

In an embodiment, the input clock $V_I$ cyclically toggles back and forth between 0V and $V_{DD}$. When $V_I$ is 0V, the NMOS transistor 212 is turned off, the PMOS transistor 211 is turned on, and the output clock $V_O$ is pulled high to $V_{DD}$ by the PMOS transistor 211. When $V_I$ toggles from 0V to $V_{DD}$, the PMOS transistor 211 is turned off, the NMOS transistor 212 is turned on and conducts current to discharge the output node 203 to pull down $V_O$ to 0V. However, the current conducted by the NMOS transistor 212 is impeded by the variable source degeneration network 220. In the particular embodiment of the digitally-controlled capacitor 222 shown inside callbox 223, a greater value of the digital word $D_W$ leads to a greater value of the capacitance of the digitally-controlled capacitor 222 and thus a lighter source degeneration to the NMOS transistor 212, resulting in a greater current discharging the output node 203 and thus less time to pull down $V_O$ to 0V. As opposed to the prior art DTC 100 of FIG. 1, which relies on controlling a capacitance at an output (i.e., drain terminal) of a transistor to control a timing of the output voltage, DTC 200 of FIG. 2 relies on controlling a capacitance at an input (i.e. source terminal) of a transistor. Since a transistor, once properly biased, is by nature an amplification device, a change at a source node (which is an input node) will result in a greater change at a drain node (which is an output node). Therefore, it takes a smaller tuning range of capacitance at the source node to cover the same timing range of the output clock.

Figure 3:
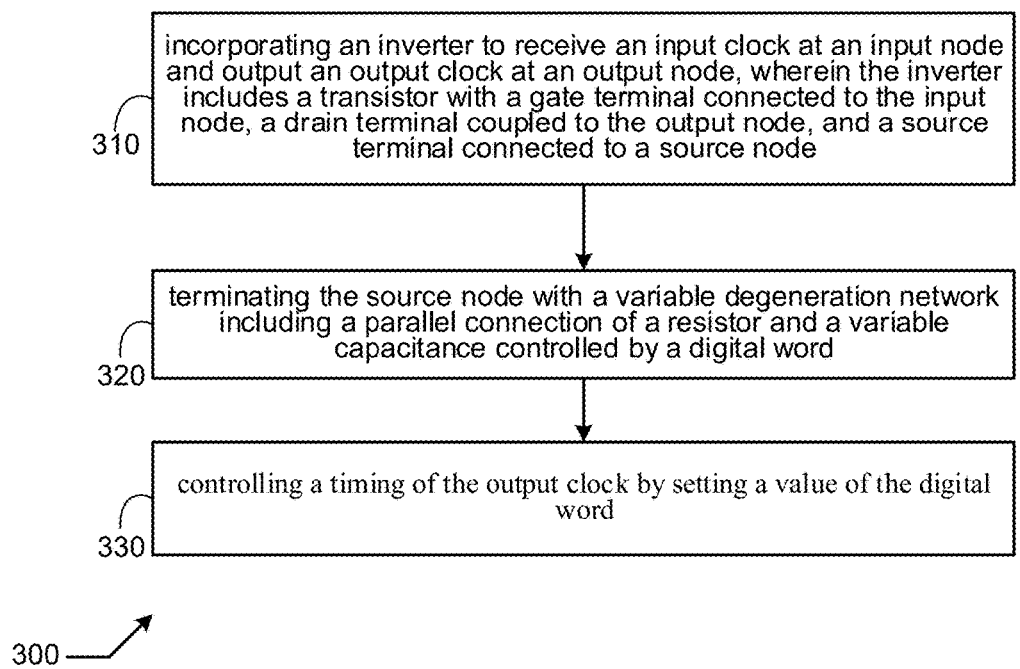
FIG. 3 shows a flow diagram of a method in accordance with an embodiment of the present disclosure.

As depicted in a flow diagram 300 shown in FIG. 3, a method includes the following steps: (step 310) incorporating an inverter to receive an input clock at an input node and output an output clock at an output node, wherein the inverter includes a transistor with a gate terminal connected to the input node, a drain terminal coupled to the output node, and a source terminal connected to a source node; (step 320) terminating the source node with a variable degeneration network including a parallel connection of a resistor and a variable capacitance controlled by a digital word; and (step 330) controlling a timing of the output clock by setting a value of the digital word.

Although in FIG. 2 the drain terminal of the NMOS transistor 212 is shown to directly connect to the output node 203, a circuit designer might choose to couple the drain terminal of the NMOS transistor 212 to the output node 203 via a cascode device. Using a cascode device to couple a drain terminal of a MOS transistor to an output node to benefit from some advantages, e.g. a higher output impedance and a better reverse isolation, is well known to those of ordinary skill in the art and thus not described in detail herein.

Figure 1:
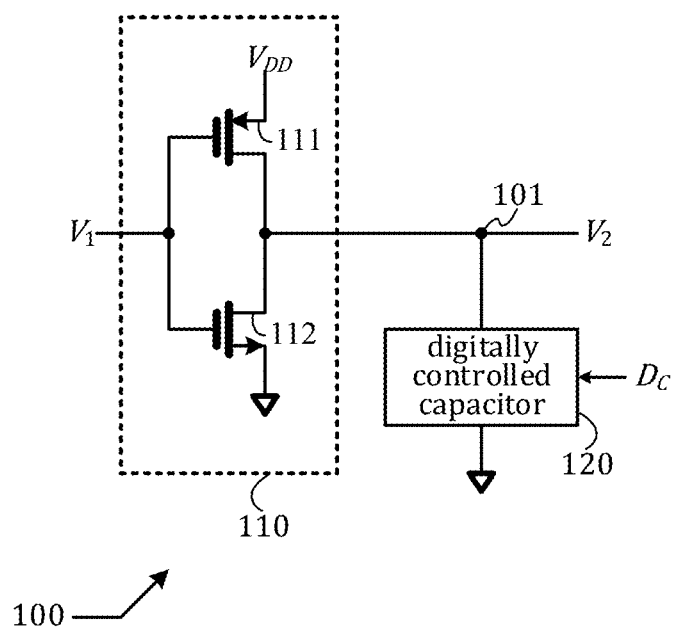
FIG. 1 shows a schematic diagram of a prior art digital-to-time converter.
Figure 4A:
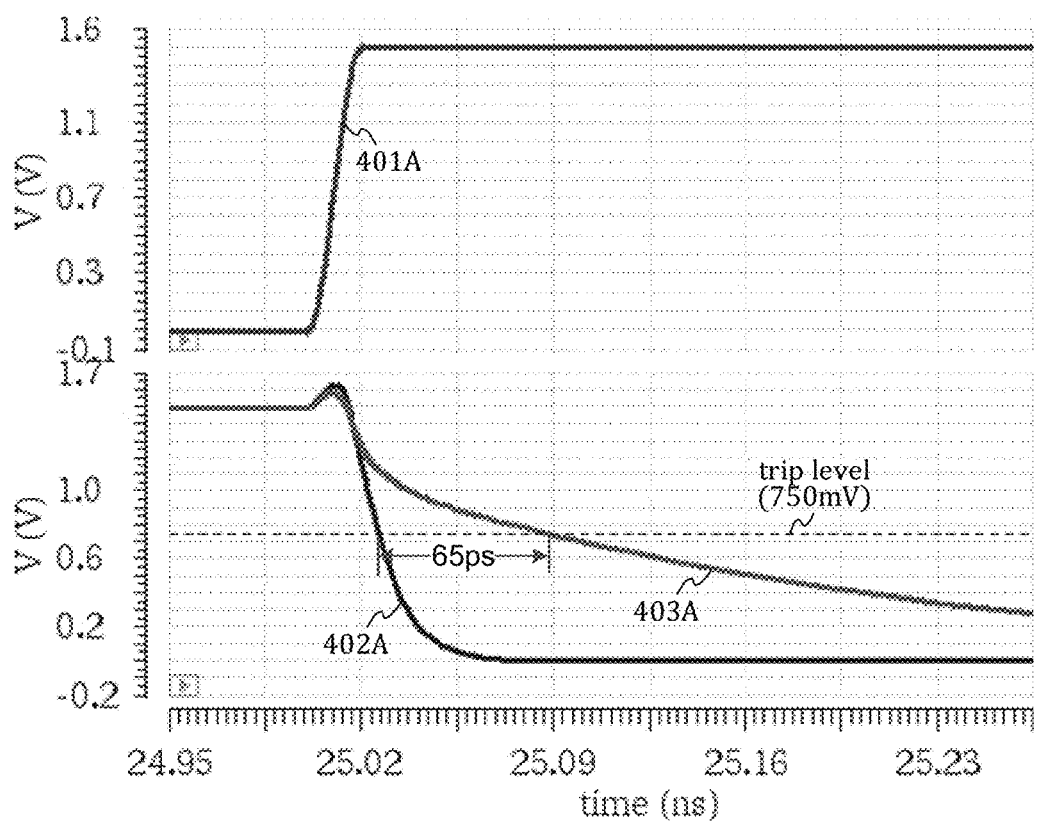
FIG. 4A shows a simulation result of the prior art digital-to-time converter of FIG. 1.
Figure 4B:
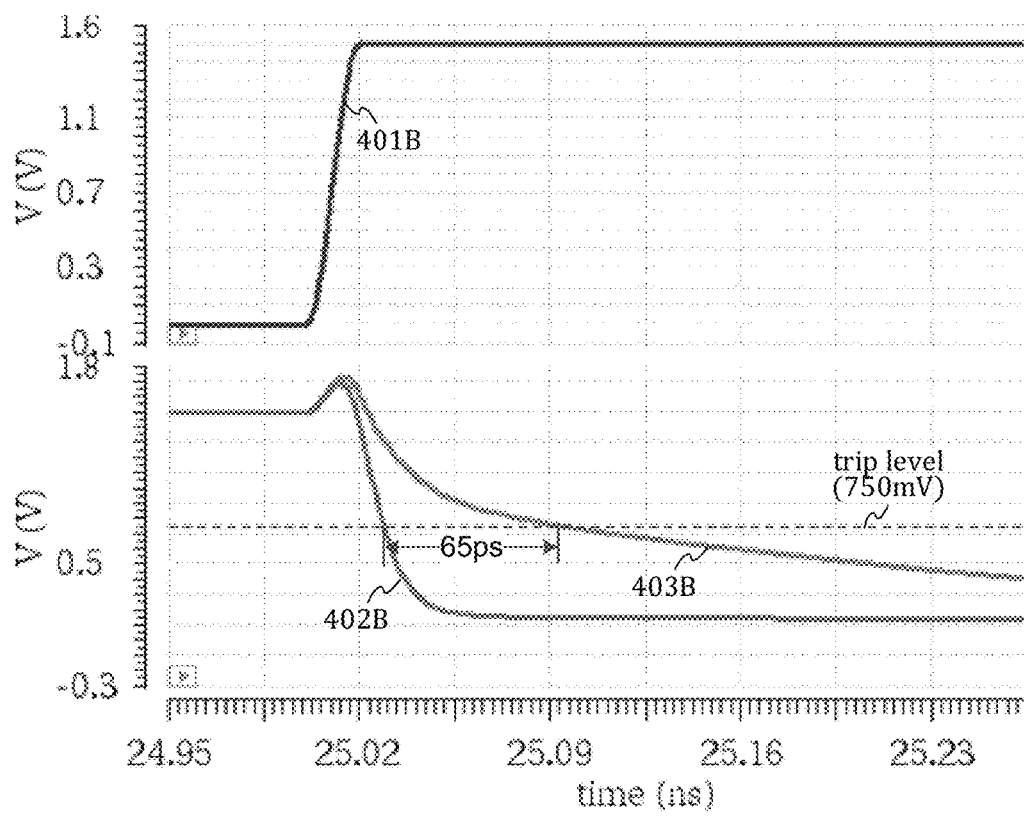
FIG. 4B shows a simulation result of the digital-to-time converter of FIG. 2.

A simulation is performed to compared DTC 100 of FIG. 1 with DTC 200 of FIG. 2. Both DTC 100 and DTC 200 are constructed using a 28 nm CMOS (complementary metal oxide semiconductor) process. For DTC 100, PMOS transistor 111 is 24 μm wide and 220 nm long, NMOS transistor 112 is 12 μm wide and 220 nm long, and digitally-controlled capacitor 122 has a tuning range of 920 fF. For DTC 200, PMOS transistor 211 is 24 μm wide and 220 nm long, NMOS transistor 212 is 12 μm wide and 220 nm long, resistor 221 is 2.8 KOhm, and digitally-controlled capacitor 222 has a tuning range of 511 fF. For both DTC 100 and DTC 200, $V_{DD}$ is 1.5V. FIG. 4A shows a simulation result of DTC 100. The horizontal axis is time, while the vertical axis is voltage. Curve 401A shows a waveform of $V_I$; curve 402A shows a waveform of $V_2$ when the digitally control capacitor 122 is set to a minimum value; and curve 403A shows a waveform of $V_2$ when the digitally control capacitor 122 is set to a maximum value. A trip level of 750 mV is used as a reference for determining timing. As shown, a timing difference of approximately 65 ps is achieved for $V_2$ in DTC 100 using a digitally-controlled capacitor of a tuning range of 920 fF. FIG. 4B shows a simulation result of DTC 200. Curve 401B shows a waveform of $V_I$; curve 402B shows a waveform of $V_O$ when the digitally control capacitor 222 is set to a maximum value; and curve 403B shows a waveform of $V_O$ when the digitally control capacitor 222 is set to a minimum value. Again, a trip level of 750 mV is used as a reference for determining timing. As shown, a timing difference of approximately 65 ps is achieved for $V_O$ in DTC 200 using a digitally-controlled capacitor of a tuning range of 511 fF. Compared to DTC 100, DTC 200 cover the same timing range using a tunable capacitance of a much narrower tuning range. Therefore, DTC 200 is much more efficient than DTC 100.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A DTC (digital-to-time converter) comprises:
   an inverter configured to receive an input clock at an input node and output an output clock at an output node, and
   a variable source degeneration network controlled by a digital word,
   wherein the inverter comprises a transistor of a first type with a gate terminal connected to the input node, a drain terminal coupled to the output node, and a source terminal connected to the variable source degeneration network, and the variable source degeneration network comprises a parallel connection of a resistor and a digitally-controlled capacitor of a capacitance controlled by the digital word.

2. The DTC of claim 1, wherein the inverter further comprises a transistor of a second type with a gate terminal connected to the input node, a drain terminal coupled to the output node, and a source terminal connected to a circuit node of a substantially fixed electrical potential.

3. The DTC of claim 1, wherein the digitally-controlled capacitor comprises a switch capacitor array.

4. The DTC of claim 3, wherein the digital word comprises a plurality bits, and the switch capacitor array comprises a plurality of switch capacitor units, each of said switch capacitor units being controlled by a respective bit of the digital word.

5. The DTC of claim 3, wherein each of said switch capacitor comprises a serial connection of a capacitor and a switch controlled by a respective bit of the digital word.

6. A method comprising:
   incorporating an inverter to receive an input clock at an input node and output an output clock at an output node, wherein the inverter comprises a transistor of a first type with a gate terminal connected to the input node, a drain terminal coupled to the output node, and a source terminal connected to a source node;

terminating the source node with a variable degeneration network including a parallel connection of a resistor and a variable capacitance controlled by a digital word; and controlling a timing of the output clock by setting a value of the digital word.

7. The method of claim 6, wherein the inverter further comprises a transistor of a second type with a gate terminal connected to the input node, a drain terminal coupled to the output node, and a source terminal connected to a circuit node of a substantially fixed electrical potential.

8. The method of claim 6, wherein the variable capacitance comprises a digitally-controlled capacitor.

9. The method of claim 8, wherein the digitally-controlled capacitor comprises a switch capacitor array.

10. The method of claim 9, wherein the digital word comprises a plurality bits, and the switch capacitor array comprises a plurality of switch capacitor units, each of said switch capacitor units being controlled by a respective bit of the digital word.

11. The method of claim 9, wherein each of said switch capacitor array comprises a serial connection of a capacitor and a switch controlled by a respective bit of the digital word.

* * * * *